(12) United States Patent
Moore et al.

(10) Patent No.: US 9,885,554 B2
(45) Date of Patent: Feb. 6, 2018

(54) MAGNETIC SENSING DEVICE

(71) Applicants: Douglas C. Moore, Chicago, IL (US); John Jablonski, Chicago, IL (US)

(72) Inventors: Douglas C. Moore, Chicago, IL (US); John Jablonski, Chicago, IL (US)

(73) Assignee: CTS CORPORATION, Lisle, IL (US)

( * ) Notice: Subject to any disclaimer, the term of this patent is extended or adjusted under 35 U.S.C. 154(b) by 529 days.

(21) Appl. No.: 14/104,687

(22) Filed: Dec. 12, 2013

(65) Prior Publication Data
US 2014/0167742 A1   Jun. 19, 2014

Related U.S. Application Data

(60) Provisional application No. 61/737,435, filed on Dec. 14, 2012.

(51) Int. Cl.
| | |
|---|---|
| *G01B 7/14* | (2006.01) |
| *G01R 33/07* | (2006.01) |
| *G01R 33/00* | (2006.01) |
| *H03K 17/95* | (2006.01) |
| *B60N 2/07* | (2006.01) |
| *B60N 2/02* | (2006.01) |

(52) U.S. Cl.
CPC .............. *G01B 7/14* (2013.01); *B60N 2/0705* (2013.01); *G01R 33/0088* (2013.01); *G01R 33/07* (2013.01); *H03K 17/9515* (2013.01); *B60N 2002/0272* (2013.01)

(58) Field of Classification Search
CPC ........................................................ G01D 5/145
See application file for complete search history.

(56) References Cited

U.S. PATENT DOCUMENTS

| | | | | |
|---|---|---|---|---|
| 4,618,823 | A * | 10/1986 | Dahlheimer | ....... H03K 17/9505 324/207.16 |
| 6,043,646 | A | 3/2000 | Jansseune | |
| 6,356,068 | B1 | 3/2002 | Steiner et al. | |
| 7,112,955 | B2 * | 9/2006 | Buchhold | .............. G01R 33/09 324/207.21 |
| 7,614,597 | B2 | 11/2009 | Matsumoto et al. | |
| 7,999,539 | B2 | 8/2011 | Nishide | |
| 2003/0155909 | A1 * | 8/2003 | Steinruecken | ......... G01D 5/147 324/207.2 |
| 2009/0051356 | A1 | 2/2009 | Nishide | |
| 2010/0026283 | A1 * | 2/2010 | Nishide | .................... B60N 2/06 324/207.26 |
| 2011/0193556 | A1 | 8/2011 | Paci et al. | |

FOREIGN PATENT DOCUMENTS

WO    WO2012085296 A1    6/2012

* cited by examiner

*Primary Examiner* — Clayton E Laballe
*Assistant Examiner* — Noam Reisner

(57) ABSTRACT

A magnetic sensing device including a U-shaped magnet with a pair of legs and a base defining a first interior channel and a distal plane. A sensor assembly in the first interior channel includes a sensor that extends above the distal plane. The magnet generates a first region of low or no flux above the distal plane in a first position of the magnet, a second region of low or no magnetic flux in the interior channel in a second position of the magnet, and a third region of magnetic flux above the distal plane in the second position of the magnet which causes the sensor to activate a control signal. The base includes steps and a second interior channel that opens into the first interior channel.

4 Claims, 10 Drawing Sheets

MAGNETIC SENSING DEVICE

CROSS-REFERENCE TO RELATED AND CO-PENDING APPLICATION

This application claims the benefit of the filing date and disclosure of U.S. Provisional Application Ser. No. 61/737,435 filed on Dec. 14, 2012, the contents of which are entirely incorporated herein by reference as are all of the references cited therein.

FIELD OF THE INVENTION

The present invention relates to a magnetic sensing device, and more particularly to a magnetic proximity sensing device for sensing the presence of a target made of a magnetic material. In one embodiment, the invention is implemented in connection with a motor vehicle seat track position sensing system

BACKGROUND OF THE INVENTION

Modern passenger vehicles commonly include advanced safety systems including active restraints and a variety of airbags and other passive restraint systems. One of the main obstacles for manufacturers and suppliers related to safety standards is ensuring competitive price while including advanced safety systems. Another issue particularly pertinent to airbag systems is implementing provisions to deactivate or adjust airbag systems depending on various conditions, including the relative seat position with respect to the instrument panel.

In response to increasingly complex safety specifications, inflatable safety restraint technology has led to the development of what has been termed "adaptive" or "smart" inflator devices and corresponding inflatable restraint systems. Some adaptive systems incorporate multistage airbags to adjust deployment depending on the relative seat position with respect to the instrument panel. In these systems the position of each seat is monitored so that a vehicle control unit can adjust the stage of each airbag. The disclosed invention relates to a system to monitor the position of vehicle seats and other related applications.

SUMMARY OF THE INVENTION

The present invention is directed to a magnetic sensing device for sensing the presence of a target of a magnetic material comprising a generally U-shaped magnet including a pair of spaced-apart legs and a base together defining a first interior channel and a distal plane, a sensor assembly located in the first interior channel and including a sensor extending above the distal plane of the magnet; and the magnet being adapted to generate a first region of low or no magnetic flux in the region of the sensor above the distal plane of the magnet in a first position of the magnet relative to the target, a second region of low or no magnetic flux in the interior channel of the magnet in a second position of the magnet relative to the target, and a third region of magnetic flux in the region of the sensor above the distal plane of the magnet in the second position of the magnet which causes the sensor to activate a control signal.

In one embodiment, the base of the magnet includes a pair of steps and a recessed surface between the steps defining a second interior channel in the magnet that opens into the first interior channel.

In one embodiment, the recessed surface in the base of the magnet is generally rectangular in shape and defines a generally rectangular shaped second interior channel in the magnet.

In one embodiment, the recessed surface in the base of the magnet is generally concave in shape and defines a generally concave shaped second interior channel in the magnet.

In one embodiment, the recessed surface in the base of the magnet is generally v-shaped and defines a generally v-shaped second interior channel in the magnet.

The present invention is also directed to a magnetic sensing device for use in a system for sensing the location of a vehicle seat on a track including a fixed rail and a sliding rail that moves relative to the fixed rail, the magnetic sensing device comprising a housing on the sliding rail, a magnet located in the housing and adapted to generate a magnetic flux, the magnet including a pair of legs defining a distal plane and a base there between together defining a first interior open channel, the base including a pair of steps and a recessed surface there between defining a second interior open channel that opens into the first interior open channel, a sensor assembly in the housing including a printed circuit board extending into the first interior open channel in the magnet and a sensor on the printed circuit board and extending in a first region above the distal plane of the legs of the magnet and adapted to sense the magnetic flux generated by the magnet and activate a control signal in response to the movement of the sliding rail between at least a first position and a second position wherein the housing is proximate the fixed rail, and the magnet generating a magnetic flux having a first area of no or low flux adapted for movement from the first region above the distal plane of the legs of the magnet into the first interior open channel in the magnet in response to the movement of the sliding rail between the first and second positions and the magnet generating a magnetic flux having a second area of flux in the first region above the distal plane of the legs of the magnet in the second position of the sliding rail that causes the sensor to activate the control signal.

In one embodiment, the base of the magnet includes a pair of steps and a recessed surface between the steps defining a second interior channel in the magnet that opens into the first interior channel.

In one embodiment, the recessed surface in the base of the magnet is generally rectangular in shape and defines a generally rectangular shaped second interior channel in the magnet.

In one embodiment, the recessed surface in the base of the magnet is generally concave in shape and defines a generally concave shaped second interior channel in the magnet.

In one embodiment, the recessed surface in the base of the magnet is generally v-shaped and defines a generally v-shaped second interior channel in the magnet.

The present invention is also directed to a proximity sensor unit comprising a U-shaped permanent magnet comprising a channel portion disposed between two sidewalls, each sidewall having a stepped portion proximate to a base portion, and a magnetic field sensor disposed in a region of low magnetic flux extending beyond a distal plane of the sidewalls, wherein the sensor is configured to detect the presence of a ferromagnetic material.

In one embodiment, the stepped portions abut the base portion.

In one embodiment, a ramp portion extends from the base portion to a top surface of the stepped portion.

In one embodiment, the ramp portion defines a profile having a gradually increasing slope extending from the base portion to a top surface of the stepped portion.

In one embodiment, the poles of the magnet are aligned along a longitudinal axis of the sidewalls.

In one embodiment, the magnetic field sensor is a Hall Effect device.

Further areas of applicability will become apparent from the description provided herein. It should be understood that the description and specific examples are intended for purposes of illustration only and are not intended to limit the scope of the present disclosure.

DETAILED DESCRIPTION OF THE DRAWINGS

DETAILED DESCRIPTION OF THE EMBODIMENTS

The magnetic sensing device or proximity sensor device described herein may be utilized in a range of applications related to sensing changes in magnet fields. The implementations disclosed herein are to be considered exemplary and not limiting to the scope of the invention. One implementation of the magnetic sensing device relates to sensing the position of a seat configured to slide and adjust along rails commonly implemented in front seats of passenger motor vehicles.

Figure 1:
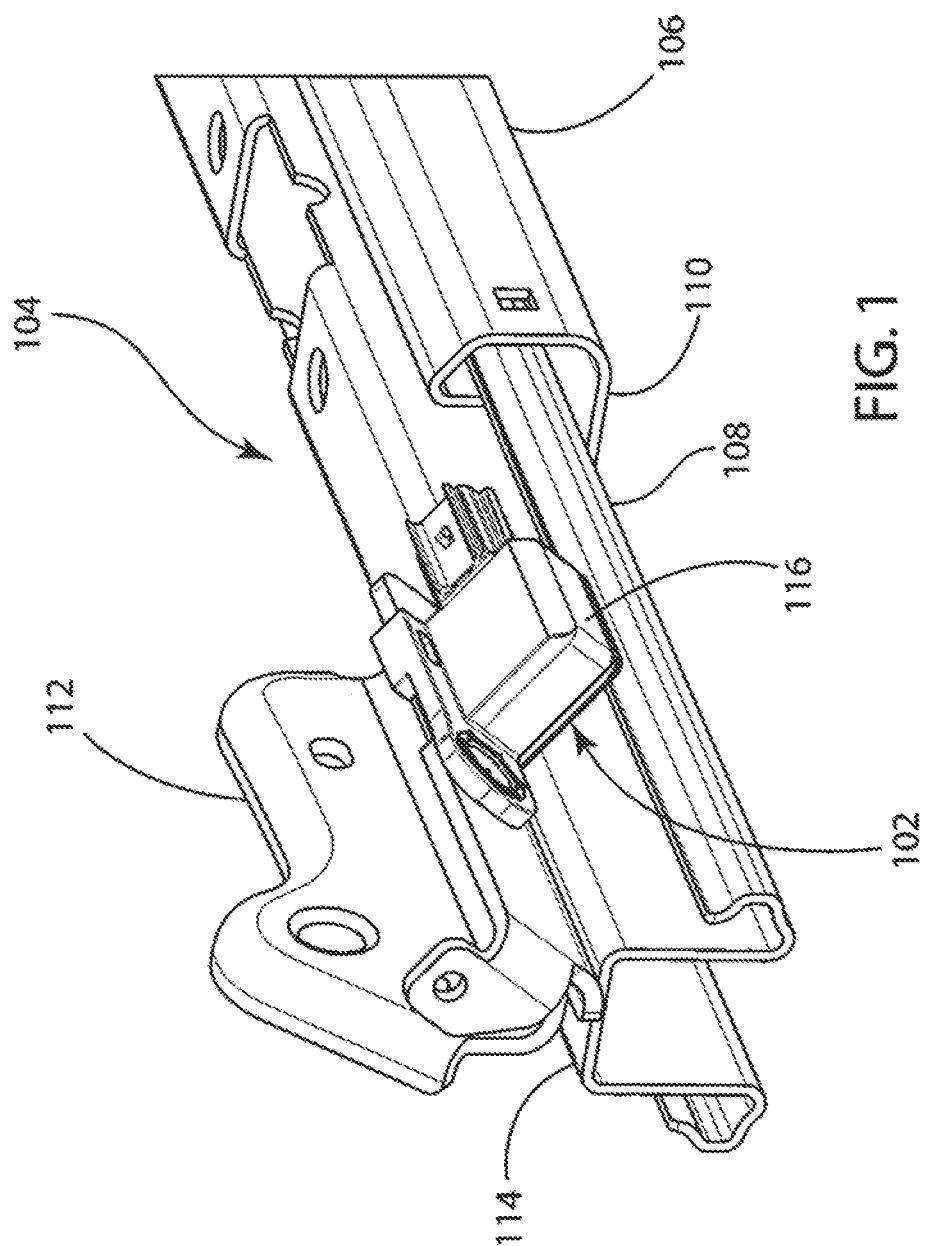
FIG. 1 is pictorial perspective view of a seat track system in an extended position in accordance with the present invention.

Referring to FIG. 1, a magnetic sensing device assembly 102 incorporated into a seat track system 104 is illustrated in conformance with the teachings of the disclosed invention. The seat track system 104 comprises a stationary track or magnetic target 106 and a sliding rail 108 shown located in an extended position in FIG. 1.

In this implementation, the track 106 is fixed to a floor of a passenger vehicle and comprises an outer profile 110. The sliding rail 108 is disposed inside the outer profile 110 of the track 106 and slidably engages the track 106 allowing a seat to be positioned in the fore-aft direction (extended-retracted position) in relation to the vehicle. A mounting bracket 112 may be disposed at a distal end portion 114 of the sliding rail 108 for attachment of a seat assembly or an intermediate mounting bracket. The seat may be positioned along the fore aft longitudinal axis by a lever configured to engage a series of retaining apertures to hold the seat in a desired position (not shown). Another implementation of the disclosure may provide for a power seat adjustment system. The construction and operation of seat adjustment systems are well known in the art and are only outlined herein.

This implementation may further include the magnetic sensing device assembly 102 comprising a sensor housing or package 116 attached to the mounting bracket 112 and configured in the embodiment shown to extend outward from an exterior face of the mounting bracket 112. The sensor housing 16 may be mounted such that when the seat is retracted in the aft or forward direction, a sensor device 118 (FIGS. 3 and 4) disposed inside the sensor housing 116 is arranged in proximity and overlying the outer profile 110 of the track 106.

Figure 2:
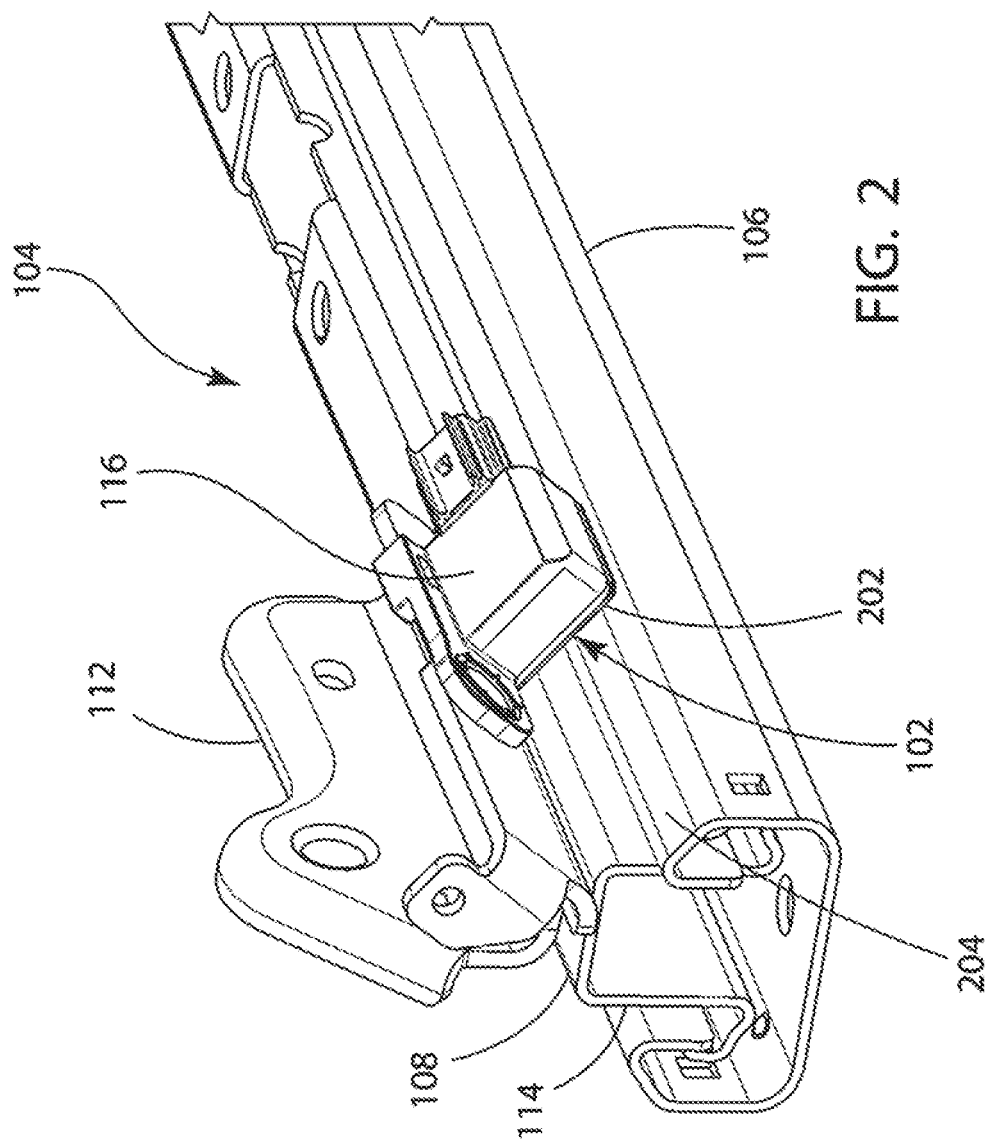
FIG. 2 is pictorial perspective view of a seat track system in a retracted position in conformance with the present invention.

Referring now to FIG. 2, the seat track system 104 is illustrated having the sliding rail 108 located in a retracted position in conformance with an implementation of the present invention. FIG. 2 more clearly illustrates a bottom surface or wall or plate 202 of the magnetic sensing device assembly 102 being configured to significantly align with, in a spaced and generally parallel and overlying relationship with, an upper surface or wall 204 of the track 106. When the sliding rail 108 is positioned or retracted such that the sensor device 118 in the sensor housing 116 is aligned over the track or target 106, the sensor device 118 senses the presence of the ferromagnetic material of the track 106. The term ferromagnetic herein refers to materials strongly attracted to magnets including iron, nickel, cobalt, alloys thereof, etc. Once the sensor device 118 detects the presence of the track 106, a control signal may be activated to apprise a vehicle control unit of a position of the seat in relation to a vehicle instrument panel.

Figure 3:
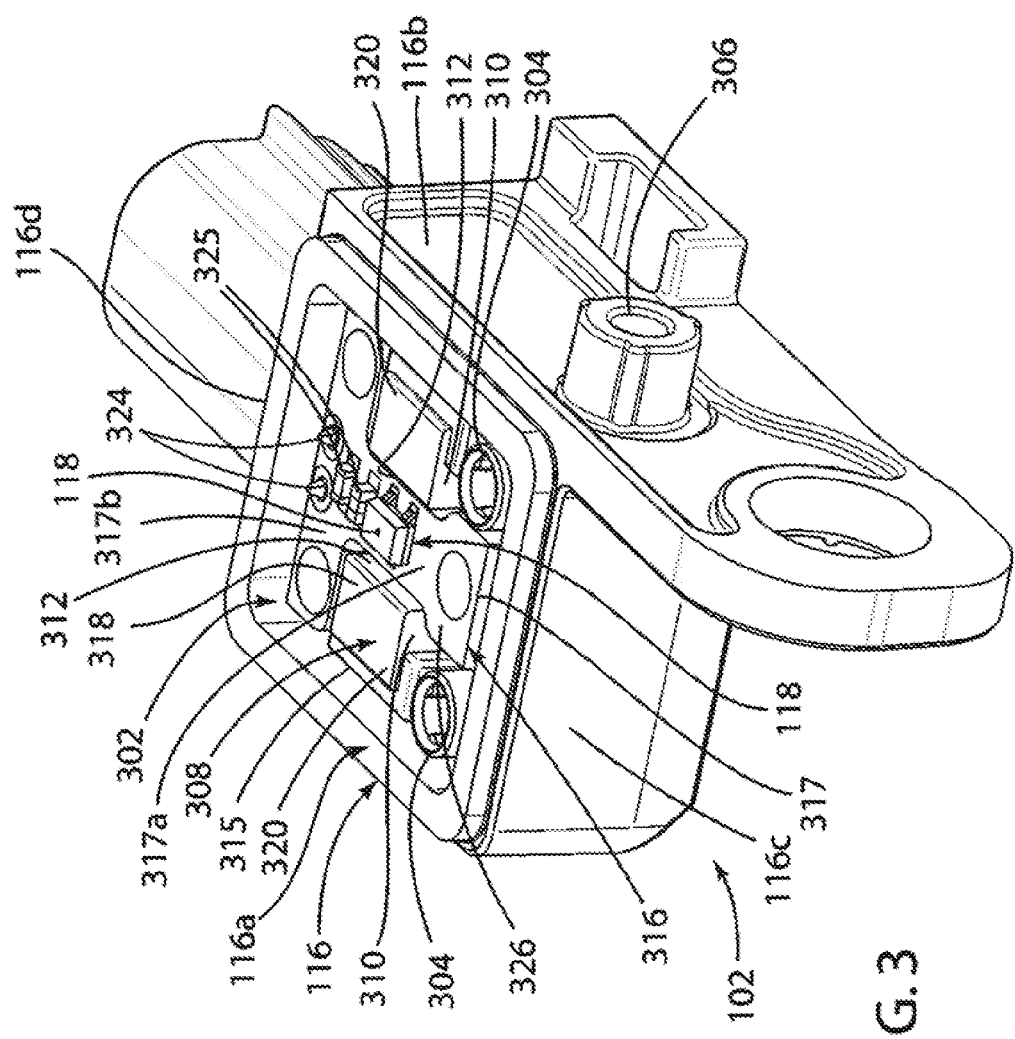
FIG. 3 is a pictorial perspective view of a sensor housing or package in accordance with the present invention.

Referring to FIG. 3, a pictorial perspective view of the sensor housing or package 116 of the assembly 102 is illustrated in accordance with the teachings of the present invention. The sensor housing 116 comprises and defines an interior insert mold cavity 302, a plurality of hollow and generally cylindrically shaped sensor housing cover retention flanges 304 formed in the cavity 302, and a hollow and generally cylindrically shaped mounting flange 306 protruding outwardly from the exterior surface of one of the side vertical walls 116b of the housing 116 for mounting the magnetic sensing device assembly 102 to the mounting bracket 112. The insert mold cavity 302 is configured to receive and house a generally U-shaped magnet 308 (FIG. 4) including two legs 310 having interior sidewalls 312 defining an interior channel or channel portion 314.

Figure 4:
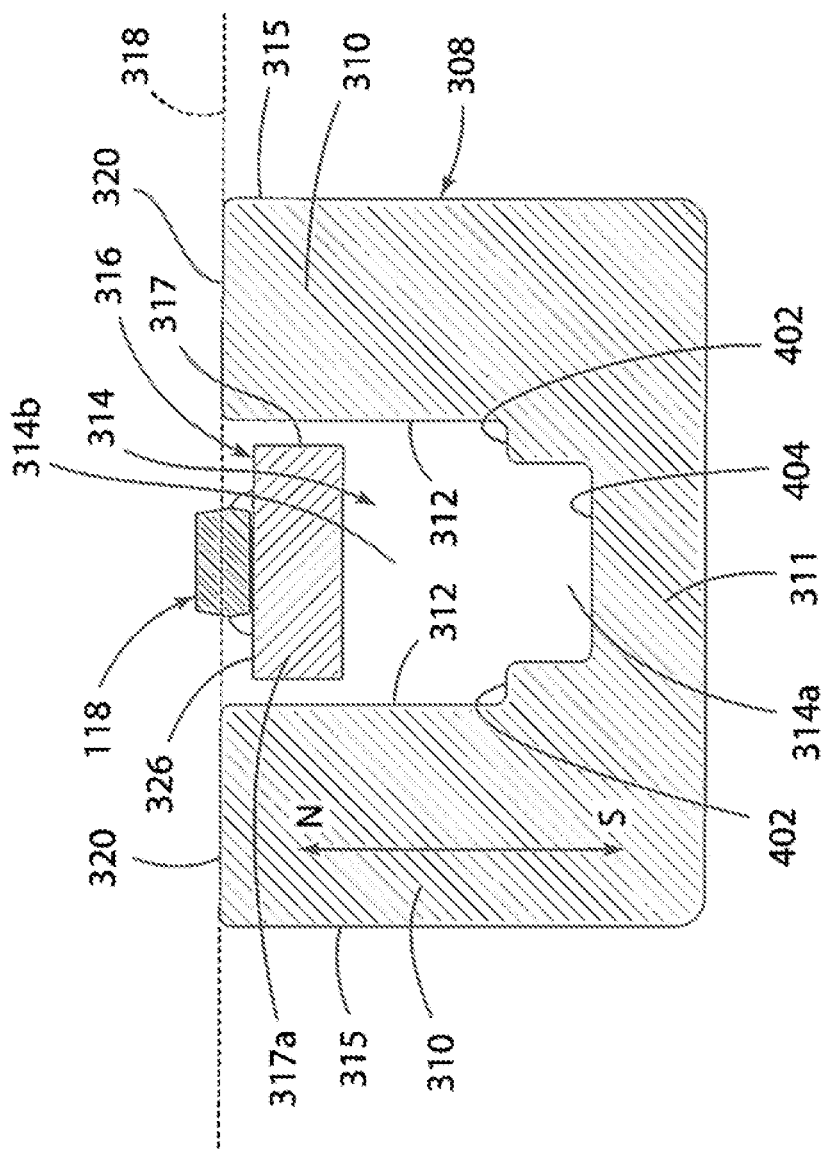
FIG. 4 is a cross-sectional vertical view of the U-shaped magnet and sensor assembly in accordance with the present invention.

More specifically, and as shown in FIG. 4, the U-shaped magnet 308 includes two spaced-apart, parallel, vertical legs 310 unitary with a lower horizontal connecting base 311. Each of the legs 310 includes an interior vertical side wall 312 and the base 311 includes an interior upper recessed base wall 404. The sidewalls 312 and the base wall 404 together define the interior open channel or channel portion 314 of the magnet 308 which includes a lower interior, generally rectangular shaped recessed base channel or channel portion 314a that opens into a wider interior open central rectangular shaped open channel or channel portion 314b.

Each of the legs 310 of the magnet 308 includes a distal horizontal end surface or face 320 which together define the distal horizontal plane 318 of the magnet 308.

In the embodiment shown, the base channel portion 314a is defined by the groove or recess that is formed in the base 311 by the recessed base wall 404 that extends downwardly into the material of the base 311 of the magnet 308. In the embodiment shown, the width and area of the recessed base channel portion 314a and the recessed base wall 404 is less than the width and area of the upper channel portion 314a and less than the distance between the opposed and facing interior side walls 312 of the legs 310 of the magnet 308 to define a horizontal base shoulder or step portion or step or surface 402 between each of the respective side walls 312 of the legs 310 and the base channel portion 314a. Thus, in the embodiment shown, the recessed base wall 404 and recessed channel 314a are located between the two steps 402 in the base 311.

During assembly of the magnetic sensing device assembly 102, the U-shaped magnet 308 is disposed in the sensor housing 116 retained therein by resin material. As shown in FIG. 3, the housing 116 is generally square in shape and includes a first pair of opposite initial side walls 116a and 116b and a second pair of opposed vertical side walls 116c and 116d normal with and extending between the side walls 116a and 116b. The magnet 308 is disposed in the interior of the housing 116 in a vertical relationship wherein the exterior facing side wall 315 of the respective legs 310 is opposed and parallel to the interior surface of the respective housing side walls 116a and 116b.

As described below in more detail, the U-shaped magnet 308 disclosed in the present invention is constructed such that a region or area of low or no magnetic flux, i.e., a region or area of flux with a minimal or zero magnitude/strength that is not sensed by the sensor device 118 and is insufficient to cause the sensory component of the sensor device 18 to cause the sensor device 118 to activate a control signal, is formed beyond or above the horizontal plane 318 defined by a distal horizontal and exterior surface or face 320 of the legs 310 of the magnet 308 and beyond and above the channel 314 of the magnet 308 in the FIGS. 1 and 5 positions of the magnet 308 and sliding rail 108. The materials used to produce permanent magnets are well known in the art and may include alnico, ferrite, etc.

The configuration of the U-shaped magnet 308 generating the region of low or no magnetic flux beyond and above the distal horizontal plane 318 of the magnet 308 is imperative to ensure that the sensor device 118 can accurately identify ferromagnetic material in the magnetic field of the U-shaped magnet 308. The following detailed description discloses exemplary implementations of the U-shaped magnet 308 in conformance with the invention.

As shown in FIGS. 3 and 4, the sensor assembly 316 comprises the sensor device 118 capable of sensing changes in the magnitude/strength and/or direction of a localized magnetic field or flux (e.g. Hall Effect Sensors, magneto-diodes, magneto-transistors, magnetometers, etc.), and preferably comprises a HED. The sensor assembly 316 further comprises a pair of terminals 324 and control circuitry in the form of capacitors, inductors, etc. (generally designated with the numeral 325 in FIG. 3) to ensure proper operation of the sensor device 118. The sensor device 118 is disposed on top of the outer surface of a substrate or printed circuit board 317 of the sensor package 316 to position a sensory component of the sensor device 118 central to the region of low or no magnetic flux beyond the distal plane 318.

More specifically, in the embodiment shown, the sensor assembly 316 includes a generally T-shaped plate or substrate or integrated printed circuit board 317 that is located and mounted in the cavity 302 of the housing 116 in a relationship wherein a central post or leg portion 317a of the T-shaped plate 317 is located in and extends through the upper portion 314b of the channel 314 of the magnet 308 and a top portion 317b of the T-shaped plate 317 is located and extends between the respective side walls 116a and 116b of the sensor housing 116. The sensor device 118 and capacitors, inductors etc., generally designated with the numeral 325 are seated on the top surface of the leg portion 317a of the plate 317 and positioned such that a lower portion of the sensor 118 is located in the open channel 314 of the magnet 308 and an upper portion of the sensor 118 and sensory component (not shown) thereof extends out of the channel 314 and is located in the region or area above and beyond the distal end face 320 of the legs 310 of the magnet 308 and the distal horizontal plane 318 of the magnet 308. The terminals 324 extend through the top portion 314b of the plate 317.

Referring to FIG. 4, a vertical cross-sectional view of the U-shaped magnet 308 and sensor assembly 316 are illustrated in accordance with the teachings of the present invention. The U-shaped magnet 308 shown has a shape consistent with the profile illustrated from front to back. The north pole N and the south pole S of the U-shaped magnet 308 are aligned perpendicular to the distal horizontal plane 318, the horizontal base wall 311 of the magnet 308, and the horizontal plate 317 of the sensor assembly 316. FIG. 4 depicts the north pole N proximate to the top distal horizontal surface 320, of each of the legs 310 of the magnet 308, and the south pole proximate to the bottom, proximal horizontal base wall 311 of the magnet 308. The polarity in this implementation and any others disclosed herein may be reversed from the direction pictured in the FIGS. and still remain in accordance with the disclosure.

Figure 5:
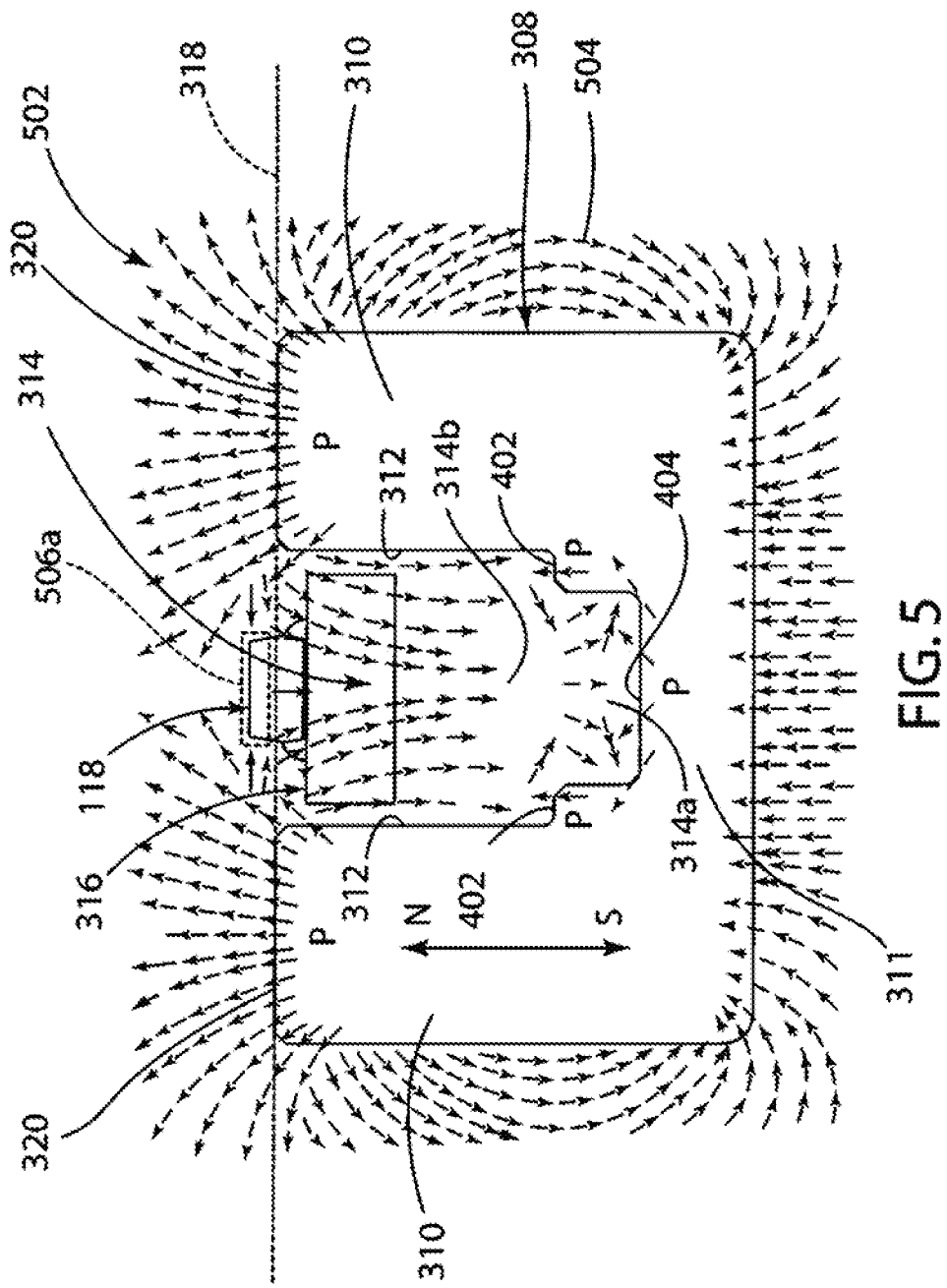
FIG. 5 is a profile side elevational view of the U-shaped magnet demonstrating a characteristic magnetic field in accordance with present invention.

FIGS. 4 and 5 further demonstrate the sensor device 118 seated against on the outer surface 326 of the plate 317 of the sensor assembly 316 and protruding out of and above the channel portion 314 of the magnet 308. The sensory component (not shown) of the sensor device 118 is located in the upper portion of the sensor device 118 and is disposed beyond and above the distal horizontal plane 318 of the magnet 308 and beyond and above the distal horizontal face 320 of the respective legs 310 of the magnet 308 and within the region of low or no flux generated by the magnet 308 in the FIGS. 1 and 5 positions of the sliding rail 108 and magnet 308. The configuration of the sensory component of the sensor 118 in this implementation provides for the sensor 118 to accurately detect changes in the magnitude and/or direction of the magnetic field or flux of the U-shaped magnet 308 by positioning the sensory component in the region of low or no flux outside and above both the channel portion 314 and the distal horizontal plane 318.

Referring to FIG. 5, a profile view of the U-shaped magnet 308 demonstrating a characteristic magnetic field 502 is illustrated in accordance with the teachings of the present invention. The magnetic field is denoted by flux lines demonstrated herein by a plurality of arrows 504. The arrows 504 indicate the direction of flux flowing from the north pole to the south pole S. North pole regions P are further identified by the areas where the flux arrows exit the U-shaped magnet 308. In this implementation, a region or area of low or no magnetic flux 506 is generated by the aforementioned physical properties of the U-shaped magnet 308 and is illustrated as the region or area having no or minimal arrows, further emphasized in the illustration by a phantom rectangular box generally designated 506a.

The combination of U-shaped configuration of the magnet 308, with vertical spaced-apart legs 310, horizontal base 311, interior channel 314 between the legs 310, recessed channel 314a defined in the base 311 and horizontal steps 402 between the channel 314a and the legs 310 generate a region of low or no flux 506a beyond and above the distal horizontal plane 318, the distal horizontal face 320 of the respective legs 310 of the magnet 308, and the channel 314 in the FIG. 1 position of the sliding rail 108 relative to the stationary rail 106. In some implementations of the magnet 308, the region of low or no flux 506 may be located at least 0.1 mm outside of the channel portion 314 relative to the distal plane 318 and the distal face 320 of the legs 310 of the magnet 308.

Thus, as described above, a distinct advantage of the exemplary configurations disclosed herein is the creation of a region of low or no flux 506a defining a sensory component location beyond and above the distal horizontal plane 318 defined by the horizontal distal end face 320 of the legs 310 of the U-shaped magnet 308. The various implementations disclosed herein allow for the use of smaller magnets which may translate into cost savings and reduced size proportions of the magnetic sensing device assembly 102 and the sensor housing 116.

Figure 6:
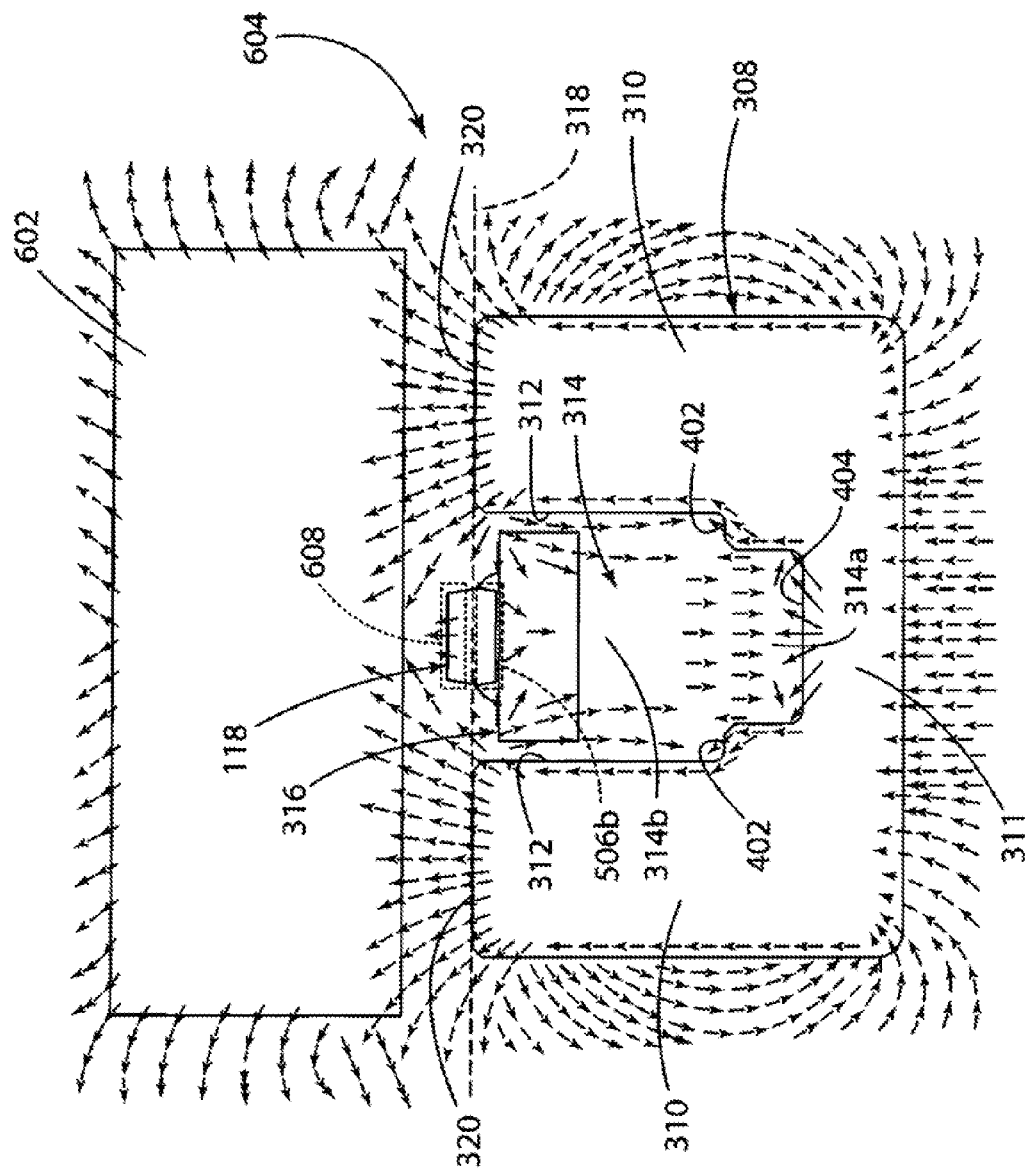
FIG. 6 is a profile side elevational view of the U-shaped magnet proximate to a ferromagnetic component demonstrating a characteristic magnetic field in accordance with the present invention.

Referring to FIG. 6, a profile view of the U-shaped magnet 308 proximate to a ferromagnetic component or target 602 (such as, for example, the seat track 106) demonstrating a characteristic magnetic field 604 is illustrated in accordance with the teachings of the present invention. A shifted or firm region or area of no or low magnetic flux 506b, generally designated by a first phantom rectangular box, is created and disposed in the channel portion 314 of the magnet 308 due to the introduction of the ferromagnetic component 602 in the magnetic field 604, and a region of flux 608, also generally designated by a phantom rectangular box, and defining a sensory component location or region or area, demonstrates that the sensory component (not shown) located in the upper portion of the sensor 118 is now exposed to the magnetic field 604. As illustrated by the arrows passing through the sensory component location, flux passes through the sensor 118 and the sensory component thereof in a generally up and down and vertical relationship and direction generally normal to the longitudinal or horizontal axis of the sensor 118 when the ferromagnetic component 602 is present. The flux passing through the sensory component, and more specifically the magnitude/strength and/or direction of the magnetic flux in region or area of flux 608, is of a sufficient predetermined minimum value that causes the sensor device 118 to activate a control signal to apprise the vehicle control unit of the presence of a ferromagnetic material. In the seat track system 104 implementation disclosed herein, the presence of the control signal may notify the vehicle control unit that the seat is in a retracted position as shown in FIG. 2.

Thus, as described above, FIG. 5 shows the magnetic flux generated by the magnet 308 with the sliding rail 108 in its extended position (forward position of the vehicle seat) relative to the stationary rail 106 as shown in FIG. 1. FIG. 6 shows the magnetic flux generated by the magnet 308 with the sliding rail 108 in its retracted position (aft/rearward position of the vehicle seat) relative to the stationary rail 106 as shown in FIG. 2 in which the magnetic sensing device 102 overlies the stationary rail 106.

As described above, the movement of the sliding rail 108 from its FIG. 1 position into its FIG. 2 position causes the region or area of low or no magnetic flux to move from its first position generally designated by the box 536a in FIG. 5, in which the region or area of low or no magnetic flux is located in the region or area above the horizontal distal plane 318 of the magnet 308 and the channel 314 of the magnet 308, to the second position generally designated by the box 506b in FIG. 6, in which the region or area of low or no magnetic flux is located below the horizontal plane 318 of the distal magnet 308 and in the portion 314b of the channel 314 of the magnet 308. Moreover, the movement of the sliding rail 108 between its FIG. 1 and FIG. 2 positions also generates an area or region of magnetic flux 608 in the region or area above the distal horizontal plane 318 formerly occupied by the region or area of no flux 506a, the magnitude and/or direction of which is detected and sensed by the sensory component of the sensor 118 and causes the activation of a signal that identifies the location of the vehicle seat.

Thus, the movement of the sliding rail from its FIG. 1 position into its FIG. 2 position causes the previously low or no flux region 506a in FIG. 5 to become the flux region 608 of FIG. 6 and the low or no flux region 506a to move down into the channel 314 and become low or no flux region 506b.

FIGS. 7-10 depict two further magnet embodiments 702 and 902 which differ in shape and configuration from the magnet 308 but are adapted to generate magnetic flux regions and fields similar in orientation and function to the magnetic flux fields generated by the magnet 308 and thus the earlier description of the magnetic flux regions and fields with reference to FIGS. 5 and 6 is incorporated herein by reference with respect to the magnet embodiments 702 and 902.

Figure 7:
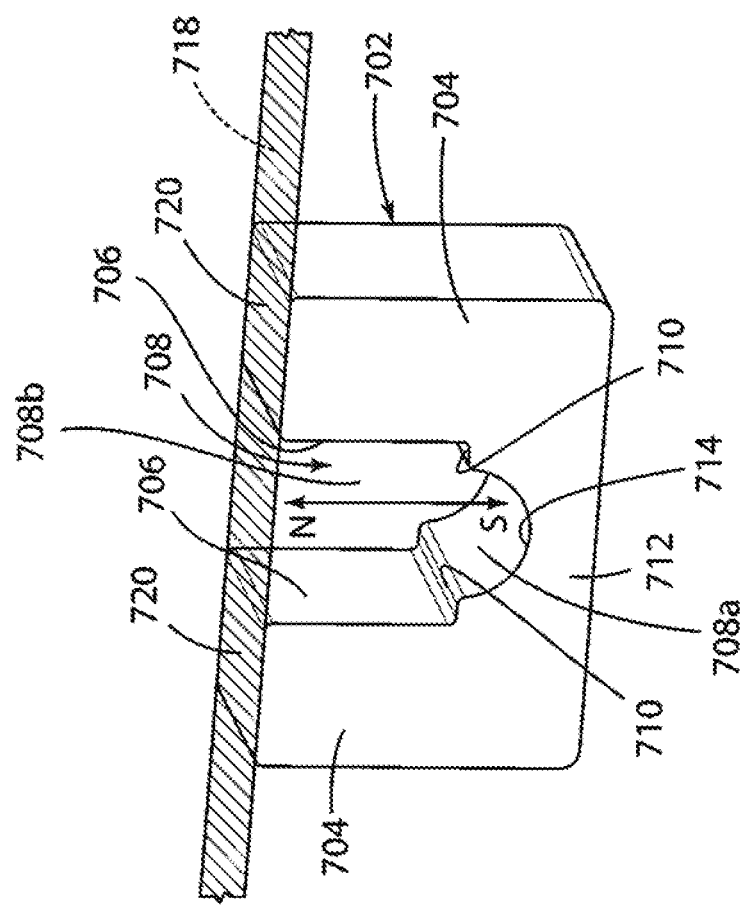
FIG. 7 is a pictorial perspective view of another implementation of a U-shaped magnet in accordance with the present invention.

Referring to FIG. 7, a pictorial perspective view of another implementation of a U-shaped magnet 702 is illustrated in accordance with the teachings of the disclosed invention. Similar to the U-shaped magnet 308 introduced in FIG. 3, this implementation comprises a U-shaped magnet 702 having two legs 704 comprising interior sidewalls 706 and an interior channel or channel portion 708. The U-shaped magnet 702 may also be disposed in the sensor housing 116 and incorporated into the magnetic sensing device assembly 102 in the same manner as disclosed in FIG. 1 and thus the earlier description is incorporated herein by reference with respect to the magnet 702. The U-shaped magnet 702 further comprises steps or stepped portions 710 disposed inside the channel portion 708, extending along a base section or portion 712, and abutting each leg 704. A base ramp portion 714 extends between the stepped portions 710.

More specifically, and as shown in FIG. 7, the U-shaped magnet 702 includes a pair of spaced-apart, parallel vertical legs 704 unitary with a lower horizontal connecting base 712. Each of the legs 704 includes an interior vertical side wall 706 and the base 712 includes an interior upper recessed base wall or ramp portion 714. The side walls 706 and the recessed base wall or ramp portion 714 together define the interior open channel portion 708 of the magnet 702 which includes a lower interior, generally semi-circular or concave shaped, recessed base channel or channel portion 708a that opens into a wider and large interior open central, generally rectangular shaped, channel or channel portion 708b.

In the embodiment of FIG. 7, the recessed concave base channel 708a is defined by the generally semi-circular or concave shaped recessed ramp portion or wall 714 of the base 712 which defines a generally concave and semi-circular shaped groove or recess in the base 712 of the magnet 702. In the embodiment shown, the width of the ramp portion or wall 708 and area of the channel 708a is less than the distance between the interior vertical side walls 706 of the legs 704 of the magnet 702 and the area of the channel 708b to define the horizontal base shoulder or step portion or step or surface 710 between each of the respective side walls 706 of the legs 704 and the base channel portion 708a defined by the base ramp portion 714. Thus, in this embodiment, the recessed base wall 714 and recessed base channel 708a are located between the two steps 710 in the base 712.

In the embodiment of FIG. 7, the recessed base ramp portion or wall 714 defines a profile having a gradually increasing slope extending from the base portion 712 to the stepped portion 710. This implementation also provides for a region of low or no magnetic flux defining a sensory component location and being formed beyond a distal horizontal plane 718 defined by a distal, horizontal, surface or face 720 of the legs 704 of the magnet 702. The north pole N and the south pole S of the U-shaped magnet 702 are aligned and extend in a direction perpendicular to the distal horizontal plane 718 and in the same direction as the vertical legs 704 of the magnet 702.

Figure 8:
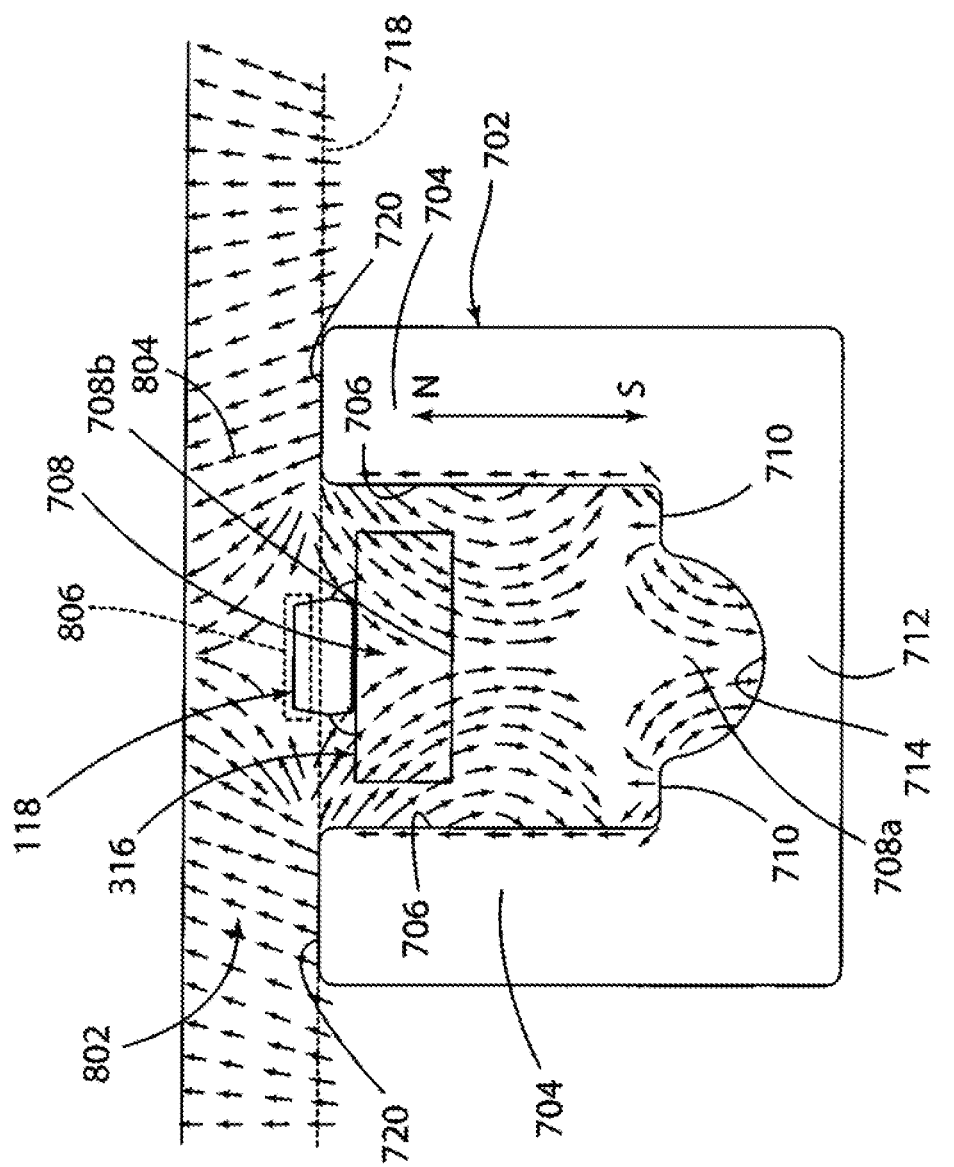
FIG. 8 is a profile side elevational view of the U-shaped magnet of FIG. 7 demonstrating a characteristic magnetic field in accordance with the present invention.

Referring to FIG. 8, a profile view of the U-shaped magnet 702 demonstrating a characteristic magnetic field 802 is illustrated in accordance with the teachings of the present invention. The magnetic field 802 is denoted by flux lines demonstrated herein by a plurality of arrows 804. The arrows 804 indicate the direction of flux flowing from the north pole N to the south pole S. In this implementation, a region or area of low or no magnetic flux 806 is generated by the physical properties of the U-shaped magnet 702 and more specifically the combination of a U-shaped magnet 702 with vertical legs 704, horizontal base 712, interior channel 708 between the legs 704, concave channel portion or recess 708a defined in the base 712, and steps 710 between the channel portion 708a and the legs 704, and is illustrated as the region or area having no arrows, further emphasized in the illustration by a phantom rectangular box generally designated by the numeral 806. In the same manner as described earlier and shown in FIG. 5, the region of low or no flux 806 defines a sensory component location beyond and above the distal horizontal plane 718 and the distal horizontal end faces 720 of the legs 704 of the magnet 702 providing for the use of smaller magnets which may translate into cost savings and reduced size proportions of the magnetic sensing device assembly 102 and the sensor housing 116.

Thus, and although not described herein in detail, it is understood that FIG. 8 depicts the magnetic field generated by the magnet 702 in the FIG. 1 position of the sliding rail 108 and that the movement of the sliding rail 108 from its FIG. 1 position into its FIG. 2 position will result in the generation by the magnet 702 of a magnetic field similar to the magnetic field depicted in FIG. 6 resulting in the movement of the region or area of low or no flux 806 from the position in FIG. 8 to the position generally designated by the box 506b in FIG. 6 and also the generation of a region of flux 608 in the region or area formerly occupied by the region or area of low or no flux 806 in FIG. 8 that allows the sensory component of the sensor 118 to generate a control signal.

Figure 9:
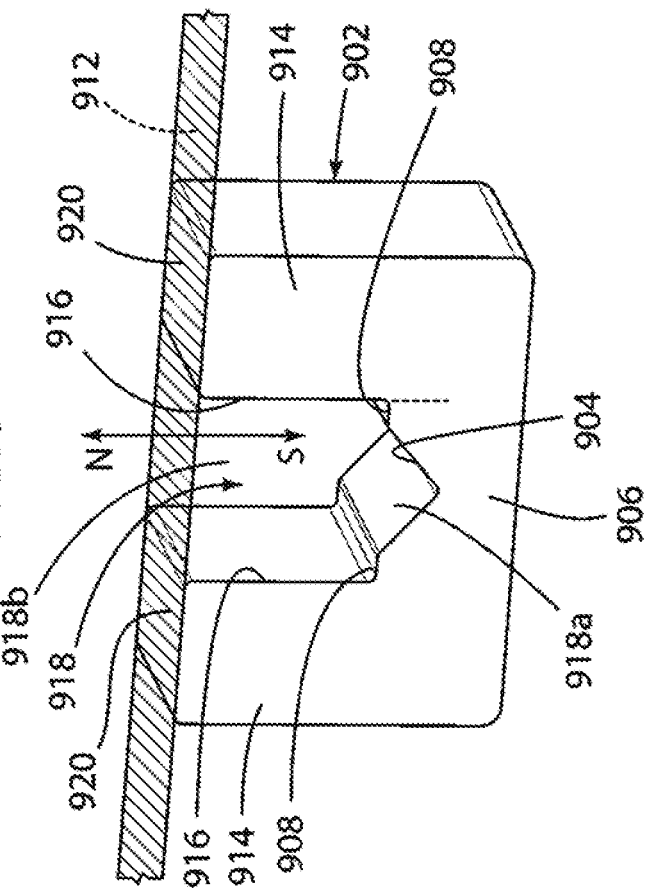
FIG. 9 is a pictorial perspective view of another implementation of a U-shaped magnet in accordance with the present invention.

Referring to FIG. 9, a pictorial perspective view of another implementation of a U-shaped magnet 902 is illustrated in accordance with the teachings of the disclosed invention. This implementation of the U-shaped magnet 902 is substantially similar to the implementations disclosed in FIGS. 4 and 7, having like features and properties the description of such like features and properties being incorporated herein by reference. The pertinent differences from the implementation of FIG. 7 comprised in this implementation include a ramp portion 904 extending from the base portion 906 to a step portion 908. The ramp portion 904 in this implementation differs in that the slope of the ramp 904 is substantially constant extending from the base portion 906 to the top step 908 and forming a triangular profile. Similar to other implementations, this implementation also provides for a region of low or no magnetic flux defining a sensory component location formed beyond a distal plane 912 of the magnet and distal horizontal end face 920 of the legs 314 of the magnet 902.

More specifically, and as shown in FIG. 9, the U-shaped magnet 902 includes two spaced-apart, parallel vertical legs 914 unitary with a lower horizontal connecting base 908. Each of the legs 906 includes an interior vertical side wall 916 and the base 906 includes an interior upper recessed base wall or ramp portion 904. The side walls 916 and the base wall or ramp portion 904 together define the interior open channel portion 918 of the magnet 902 which includes a lower interior, generally triangularly-shaped, recessed base channel or channel portion 918a that opens into a wider and larger interior open central generally rectangular-shaped, channel or channel portion 918b.

In the embodiment of FIG. 9, the recessed base channel or channel portion 918a is defined by the generally triangularly-shaped recessed ramp portion or wall 904 of the base 906 which defines a generally triangularly-shaped recessed groove or recess extending into the material of the base 906 of the magnet 902. In the embodiment shown, the width of the recessed ramp portion or wall 904 and the area of the channel 918a is less than the distance between the interior vertical side walls 916 of the legs 914 of the magnet 902 and the area of the channel 918b and defines the horizontal base shoulder or step portion or step or surface 908 between each of the respective side walls 916 of the legs 904 and the base channel portion 918a defined by the base ramp portion 904. Thus, in the embodiment shown, the recessed base wall 904 and recessed channel 918a are located between the two steps 908 in the base 906.

Figure 10:
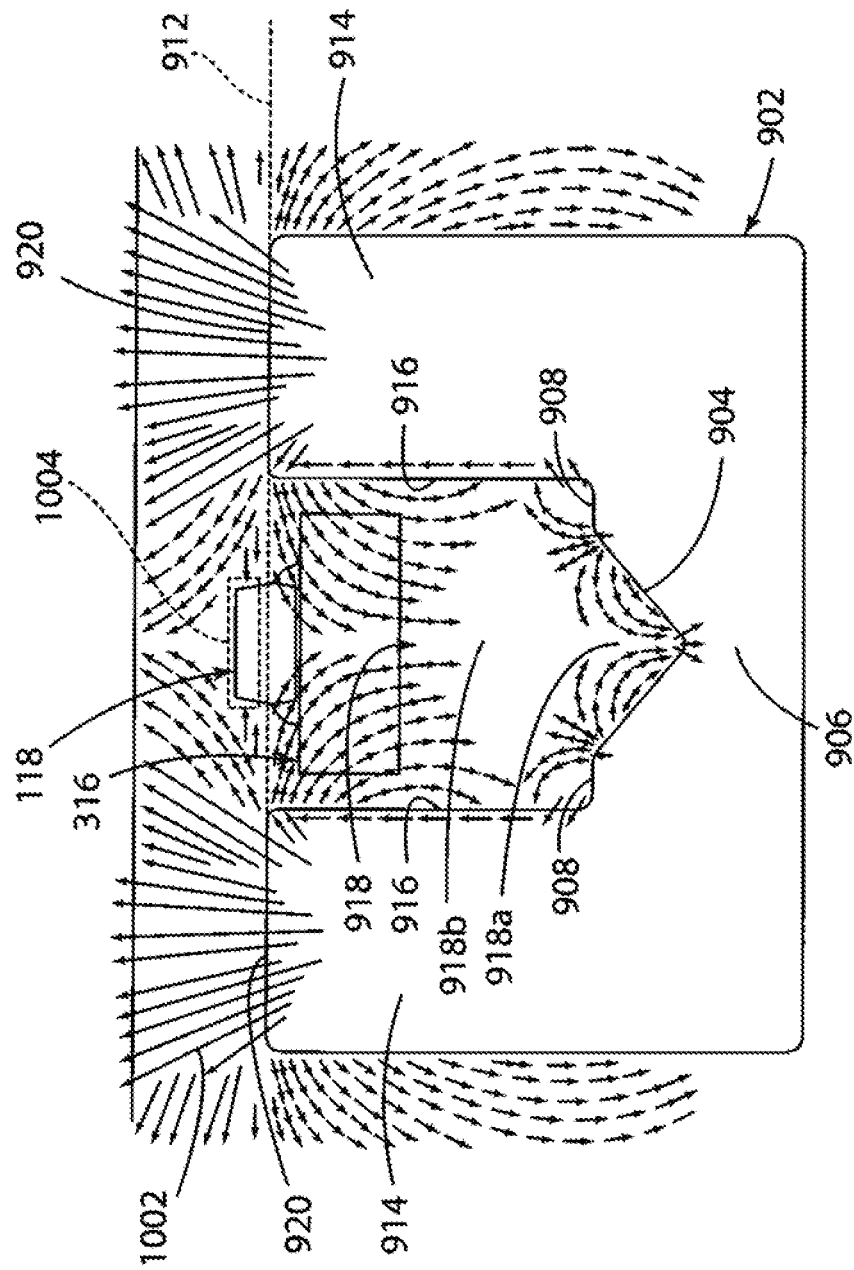
FIG. 10 is a profile side elevational view of the U-shaped magnet of FIG. 9 demonstrating a characteristic magnetic field in accordance with the present invention.

Referring to FIG. 10, a profile view of the U-shaped magnet 902 demonstrating a characteristic magnetic field 1002 is illustrated in accordance with the teachings of the present invention. In this implementation, a region of low or no magnetic flux 1004 is generated by the physical properties of the U-shaped magnet 902 and more specifically the combination of a U-shaped magnet 902 with vertical legs 914, horizontal base 906, interior open channels 918a and 918b, and the steps 908 and is illustrated as the region having minimal or no arrows, further emphasized in the illustration by a rectangular box generally designated with the numeral 1004. In this implementation as in the other various implementations disclosed herein and the description of which is incorporated herein by reference, the sensory component of the magnetic sensing device is located in a region of low or no flux located outside the channel portion 918 and horizontal plane 912 of the magnet 902 in the FIG. 1 position of the magnetic sensing device 102.

Thus, and although not described herein in detail, it is understood that FIG. 10 depicts the magnetic field generated by the magnet 902 in the FIG. 1 portion of the sliding rail 108 and that the movement of the sliding rail 108 from its FIG. 1 position into its FIG. 2 position will result in the generation by the magnet 902 of a magnetic field similar to the magnetic field depicted in FIG. 6 resulting in the movement of the region of low or no flux from the position in FIG. 10 to the position generally designated by the box 506b in FIG. 6 and also the generation of a region of flux 608 in the region or area formerly occupied by the region or area of low or no flux 806 FIG. 10 to allow the sensory component of the sensor 118 to generate a control signal.

The magnetic sensing device described herein may be embodied in other forms without departing from its spirit or characteristics. The described embodiments are to be considered in all respects only as illustrative and not restrictive. The scope of the invention is therefore, indicated by the appended claims rather than by the foregoing description. All changes which come within the meaning and range of equivalency of the claims are to be embraced within their scope.

What is claimed is:

1. A magnetic sensing device for sensing the presence of a target of a magnetic material comprising:
    a sensor housing including respective sidewalls;
    a generally U-shaped magnet with N and S poles and including a pair of spaced-apart legs unitary with a connecting base together defining a first interior channel and a distal plane, the base including a pair of steps and a recessed surface between the steps defining a second interior channel in the base of the magnet that opens into the first interior channel;
    a sensor assembly located in the first interior channel and including a generally T-shaped printed circuit board spaced and separate from the magnet, the printed circuit board including a central leg portion and a top portion, the top portion including terminals and extending between the respective sidewalls of the sensor housing and the central leg portion extending between the legs of the magnet and located in the first interior channel and a Hall Effect sensor seated on a top surface of the central leg portion of the printed circuit board and spaced and separate from the magnet and extending above the distal plane of the pair of spaced-apart legs of the magnet; and
    the magnet being adapted to generate a first region of low or no magnetic flux in the region of the sensor above the distal plane of the magnet and between the pair of spaced-apart legs of the magnet in a first position of the magnet relative to the target, a second region of low or no magnetic flux in the interior channel of the magnet in a second position of the magnet relative to the target, and a third region of magnetic flux in the region of the sensor above the distal plane of the magnet formerly comprising the first region of low or no magnetic flux in the second position of the magnet which causes the sensor to activate a control signal.

2. The magnetic sensing device of claim 1, wherein the recessed surface is generally rectangular in shape and defines a generally rectangular shaped second interior channel in the magnet.

3. The magnetic sensing device of claim 1, wherein the recessed surface is generally concave in shape and defines a generally concave shaped second interior channel in the magnet.

4. The magnetic sensing device of claim 1, wherein the recessed surface is generally v-shaped and defines a generally v-shaped second interior channel in the magnet.

* * * * *